(12) United States Patent
Mori et al.

(10) Patent No.: US 10,332,812 B2
(45) Date of Patent: Jun. 25, 2019

(54) CASE HAVING TERMINAL INSERTION PORTION FOR AN EXTERNAL CONNECTION TERMINAL

(71) Applicant: Mitsubishi Electric Corporation, Tokyo (JP)

(72) Inventors: Takuro Mori, Fukuoka (JP); Hayato Nagamizu, Fukuoka (JP); Yoshitaka Otsubo, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 0 days.

(21) Appl. No.: 15/660,994

(22) Filed: Jul. 27, 2017

(65) Prior Publication Data
US 2018/0182679 A1    Jun. 28, 2018

(30) Foreign Application Priority Data
Dec. 28, 2016 (JP) .................. 2016-255989

(51) Int. Cl.
*H01L 23/48* (2006.01)
*H01R 9/00* (2006.01)
*H01L 21/00* (2006.01)
*H01L 23/10* (2006.01)
*H01L 21/48* (2006.01)
(Continued)

(52) U.S. Cl.
CPC .......... *H01L 23/10* (2013.01); *H01L 21/4875* (2013.01); *H01L 21/56* (2013.01); *H01L 23/049* (2013.01); *H01L 23/24* (2013.01); *H01L 23/3735* (2013.01); *H01L 23/49517* (2013.01);
(Continued)

(58) Field of Classification Search
CPC .............. H01L 23/49838; H01L 23/10; H01L 21/4875; H01L 21/56; H01L 23/049; H01L 23/49517; H01L 23/49555
See application file for complete search history.

(56) References Cited

U.S. PATENT DOCUMENTS 6,421,244 B1 * 7/2002 Shinohara ............... H01L 23/24
257/E23.14
7,445,519 B2 * 11/2008 Matsumoto .......... H05K 7/1432
257/690
(Continued)

FOREIGN PATENT DOCUMENTS

JP          4985116 B2    5/2012

*Primary Examiner* — Alonzo Chambliss
(74) *Attorney, Agent, or Firm* — Studebaker & Brackett PC

(57) ABSTRACT

A semiconductor device includes: a base plate; an insulating substrate provided on an upper surface of the base plate; a conductive pattern provided on an upper surface of the insulating substrate; a semiconductor chip mounted on an upper surface of the conductive pattern; a case surrounding the base plate, the insulating substrate, the conductive pattern, and the semiconductor chip; a sealing resin sealing an interior of the case; and an external connection terminal provided to the case. One end portion of the external connection terminal is connected to the conductive pattern, the case has a terminal insertion portion enabling insertion of the other end portion of the external connection terminal in a peripheral wall portion thereof, and a portion of the external connection terminal other than the other end portion is sealed by the sealing resin with the other end portion being inserted in the terminal insertion portion.

9 Claims, 7 Drawing Sheets

(51) Int. Cl.
*H01L 21/56* (2006.01)
*H01L 23/049* (2006.01)
*H01L 23/495* (2006.01)
*H01L 23/24* (2006.01)
*H01L 23/373* (2006.01)
*H01L 23/498* (2006.01)

(52) U.S. Cl.
CPC .. *H01L 23/49555* (2013.01); *H01L 23/49811* (2013.01)

(56) References Cited

U.S. PATENT DOCUMENTS

| | | | | |
|---|---|---|---|---|
| 7,944,042 | B2* | 5/2011 | Yoshihara | H01L 23/26 257/690 |
| 8,598,697 | B2* | 12/2013 | Kirsch | H01L 23/047 257/690 |
| 9,455,215 | B2* | 9/2016 | Imoto | H01L 23/24 |
| 2008/0142948 | A1* | 6/2008 | Matsumoto | H01R 4/04 257/690 |
| 2009/0102040 | A1* | 4/2009 | Specht | H01L 21/4817 257/690 |
| 2014/0042609 | A1* | 2/2014 | Nagaune | H01L 24/34 257/692 |
| 2014/0167242 | A1* | 6/2014 | Kim | H01L 23/053 257/690 |
| 2015/0077943 | A1* | 3/2015 | Miyake | H01L 23/053 361/709 |
| 2016/0071778 | A1* | 3/2016 | Otsubo | H01L 21/486 257/687 |
| 2016/0093589 | A1* | 3/2016 | Sato | H01L 23/49838 257/690 |
| 2016/0336245 | A1* | 11/2016 | Egusa | H01R 12/585 |

* cited by examiner

F I G . 3
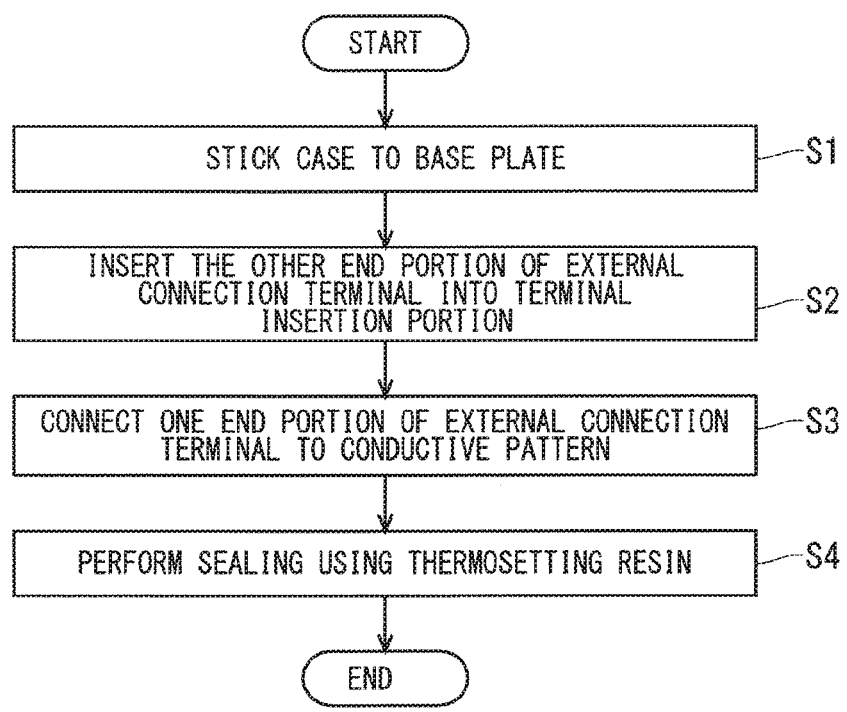

F I G . 4
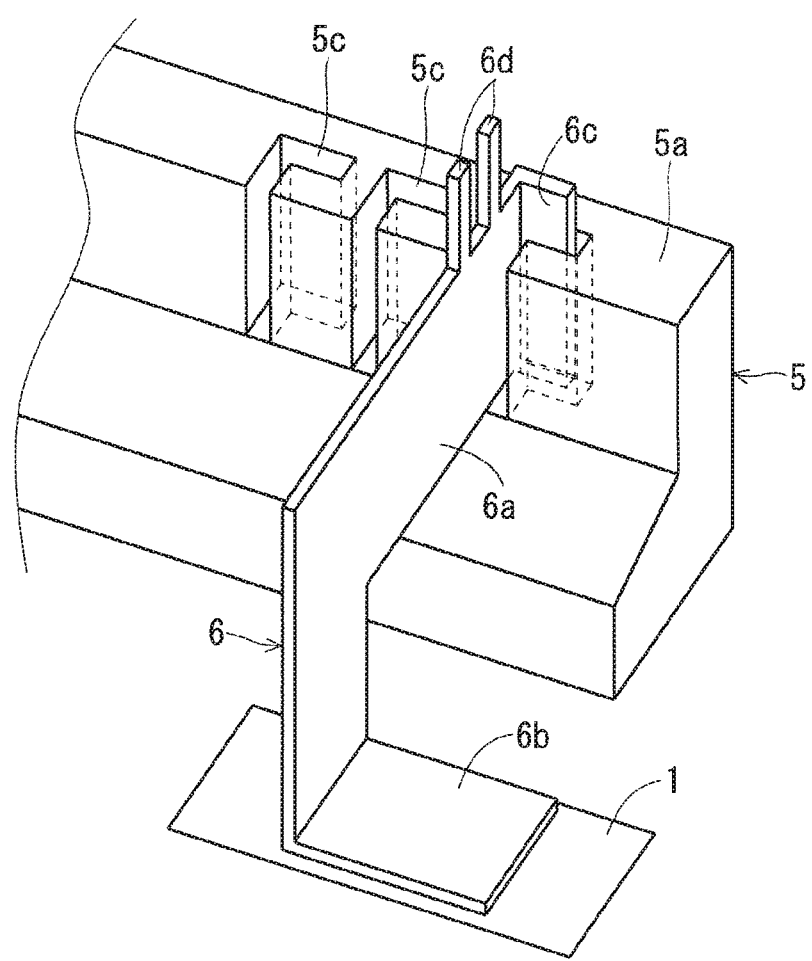

F I G . 5
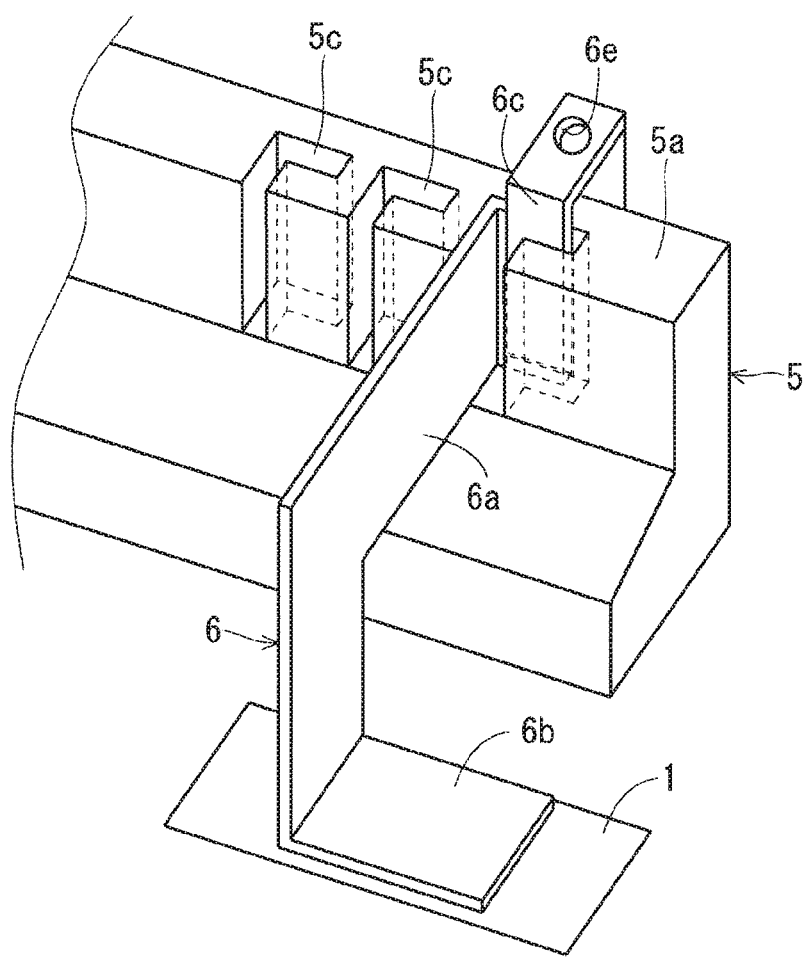

CASE HAVING TERMINAL INSERTION PORTION FOR AN EXTERNAL CONNECTION TERMINAL

BACKGROUND OF THE INVENTION

Field of the Invention

The present invention relates to a semiconductor device and a method of manufacturing the same.

Description of the Background Art

A semiconductor device includes a base plate, an insulating substrate provided on an upper surface of the base plate, a semiconductor chip mounted on an upper surface of the insulating substrate, and a case surrounding the base plate, the insulating layer, and the semiconductor chip. The interior of the case is sealed by a sealing resin.

Japanese Patent No. 4985116 discloses a semiconductor device in which a laminated assembly of a semiconductor chip, an insulating circuit board on which the semiconductor chip is mounted, and a metal base for heat dissipation is combined with a surrounding resin case, for example. In this semiconductor device, bonding wire is provided between leg portions of external terminals arranged in a peripheral wall portion of the surrounding resin case and a conductor pattern of the insulating circuit board or between the leg portions and the semiconductor chip while drawing the leg portions inside the surrounding resin case. The external terminals are attached, by press fitting from a metal base side, to terminal mounting holes formed in advance in the peripheral wall portion of the surrounding resin case. A gap between the L-shaped leg portions of the external terminals and the metal base is filled with a terminal-holding frame to support the external terminals at predetermined attachment positions.

As in the semiconductor device disclosed in Japanese Patent No. 4985116, conventional outsert terminals are connected to the insulating circuit board by a conductive material such as the bonding wire. With this structure, heat dissipation of the terminals is dependent on heat dissipation of the conductive material, and is insufficient as heat dissipation of the conductive material is insufficient due to an extremely small width of the conductive material. In addition, the terminals need to be firmly fixed to the case in connecting the conductive material. This requires application of an adhesive material, fitting of a fixing lid, or the like, adding to parts and manufacturing processes to increase manufacturing costs.

SUMMARY OF THE INVENTION

It is an object of the present invention to provide technology of reducing an increase in manufacturing costs and enabling a semiconductor device to include a terminal having favorable heat dissipation.

The semiconductor device according to the present invention includes a base plate, an insulating substrate, a conductive pattern, a semiconductor chip, a case, a sealing resin, and an external connection terminal. The insulating substrate is provided on an upper surface of the base plate. The conductive pattern is provided on an upper surface of the insulating substrate. The semiconductor chip is mounted on an upper surface of the conductive pattern. The case surrounds the base plate, the insulating substrate, the conductive pattern, and the semiconductor chip. The sealing resin seals the interior of the case. The external connection terminal is provided to the case. One end portion of the external connection terminal is connected to the conductive pattern. The case has, in a peripheral wall portion thereof, a terminal insertion portion enabling insertion of the other end portion of the external connection terminal. With the other end portion of the external connection terminal being inserted in the terminal insertion portion, a portion of the external connection terminal other than the other end portion is sealed by the sealing resin.

One end portion of the external connection terminal is connected to the conductive pattern, the case has, in the peripheral wall portion thereof, the terminal insertion portion enabling insertion of the other end portion of the external connection terminal, and the portion of the external connection terminal other than the other end portion is sealed by the sealing resin with the other end portion of the external connection terminal being inserted in the terminal insertion portion.

The external connection terminal can thus be fixed to the case only by inserting the other end portion of the external connection terminal into the terminal insertion portion, leading to reduction in increase in manufacturing costs of the semiconductor device. One end portion of the external connection terminal is connected to the conductive pattern, and the external connection terminal has a larger width than the conductive material such as the bonding wire, so that heat generated in the other end portion of the external connection terminal is easily transferred to the base plate. This enables the semiconductor device to include the external connection terminal having favorable heat dissipation.

These and other objects, features, aspects and advantages of the present invention will become more apparent from the following detailed description of the present invention when taken in conjunction with the accompanying drawings.

BRIEF DESCRIPTION OF THE DRAWINGS

FIG. 3 is a flowchart for describing a method of manufacturing the semiconductor device according to Embodiment 1;

FIG. 4 is a perspective view illustrating the internal structure of a semiconductor device according to Embodiment 2;

FIG. 5 is a perspective view illustrating the internal structure of a semiconductor device according to Embodiment 3;

DESCRIPTION OF THE PREFERRED EMBODIMENTS

Embodiment 1

Figure 1:
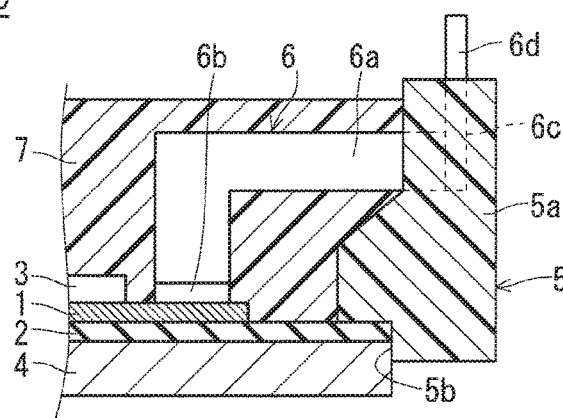
FIG. 1 is a cross sectional view of a semiconductor device according to Embodiment 1.
Figure 2:
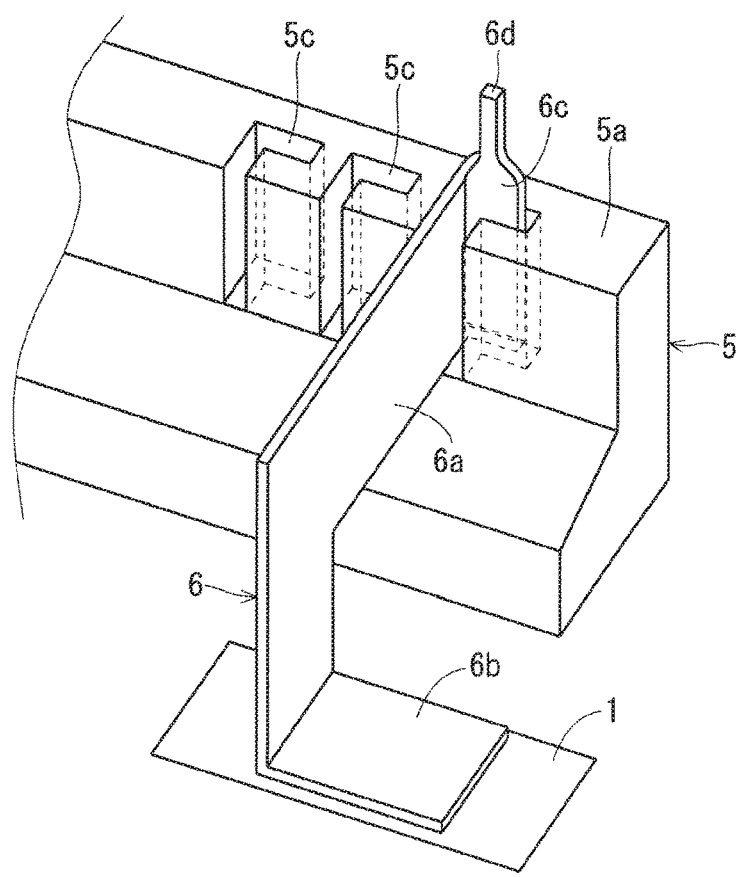
FIG. 2 is a perspective view illustrating the internal structure of the semiconductor device according to Embodiment 1.

Embodiment 1 of the present invention will be described below with reference to the drawings. FIG. 1 is a cross sectional view of a semiconductor device 100 according to Embodiment 1. FIG. 2 is a perspective view illustrating the internal structure of the semiconductor device 100. The following description is made by defining a horizontal direction, a vertical direction, a forward direction, and a backward direction with respect to the plane of FIG. 1 as a horizontal direction, a vertical direction, a forward direction, and a backward direction, respectively.

As illustrated in FIG. 1, the semiconductor device 100 includes a base plate 4, an insulating substrate 2, a conductive pattern 1, a semiconductor chip 3, a case 5, an external connection terminal 6, and a sealing resin 7.

The base plate 4 is, for example, formed of metal such as copper to be rectangular in plan view. The insulating substrate 2 is, for example, formed of an epoxy resin, and provided over the entire upper surface of the base plate 4. The conductive pattern 1 is, for example, formed of copper, and provided on an upper surface of the insulating substrate 2. The semiconductor chip 3 is mounted on an upper surface of the conductive pattern 1.

The case 5 includes a peripheral wall portion 5a that is in the shape of a rectangular frame in plan view, and surrounds the base plate 4, the insulating substrate 2, the conductive pattern 1, and the semiconductor chip 3. A lower portion of the peripheral wall portion 5a protrudes inward. A lower end portion of the peripheral wall portion 5a has, over the entire inner periphery thereof, a recess 5b into which an upper portion of the base plate 4 and the insulating substrate 2 can be fitted.

As illustrated in FIGS. 1 and 2, the external connection terminal 6 is, for example, formed of a copper thin plate, and includes a body portion 6a, a connection portion 6b, a terminal portion 6c, and an external connection portion 6d. The body portion 6a is composed of a horizontal portion extending in the horizontal direction and a vertical portion extending downward from one end portion of the horizontal portion, and is L-shaped in cross section. The body portion 6a is disposed with its main surface facing forward. In FIG. 2, the base plate 4, the insulating substrate 2, the sealing resin 7, and a front portion of the case 5 are omitted for clarity. The same applies to the drawings following FIG. 2.

The connection portion 6b is provided to one end portion of the body portion 6a as if it had been bent forward. The connection portion 6b is disposed with its main surface facing upward, and is connected to the conductive pattern 1 via a connection surface opposite the main surface.

The terminal portion 6c is provided to the other end portion of the body portion 6a. A tip portion of the terminal portion 6c is formed as if it had been bent forward, and the terminal portion 6c is L-shaped in plan view. A plurality of terminal insertion portions 5c enabling insertion of the terminal portions 6c are provided in an upper portion of the peripheral wall portion 5a. The terminal insertion portions 5c are each composed of a front-to-back portion extending in a front-to-back direction and a horizontal portion extending in the horizontal direction from a back end portion of the front-to-back portion, and are each L-shaped in plan view.

The terminal portion 6c has been inserted in the terminal insertion portion 5c to be electrically connected to the conductive pattern 1 via the body portion 6a and the connection portion 6b. An upper portion of the terminal portion 6c and the external connection portion 6d provided to an upper end portion of the terminal portion 6c herein protrude upward from the terminal insertion portion 5c. The connection portion 6b is included in one end portion of the external connection terminal 6, and the terminal portion 6c is included in the other end portion of the external connection terminal 6.

The sealing resin 7 is a thermosetting resin, for example, and seals the interior of the case 5. With the other end portion, namely the terminal portion 6c, of the external connection terminal 6 being inserted in the terminal insertion portion 5c, a portion of the external connection terminal 6 other than the other end portion is sealed by the sealing resin 7. More specifically, the body portion 6a and the connection portion 6b are sealed by the sealing resin 7. Not only the body portion 6a and the connection portion 6b but also the terminal portion 6c is thereby fixed by the sealing resin 7.

A characteristic process of the method of manufacturing the semiconductor device 100 will be described next with reference to FIG. 3. FIG. 3 is a flowchart for describing the method of manufacturing the semiconductor device 100.

As shown in FIG. 3, in step S1, a case 5 is stuck to the base plate 4 over which the insulating substrate 2 and the conductive pattern 1 have been provided. In sticking the case 5, a silicon adhesive or the like is applied onto the recess 5b of the case 5, and the upper portion of the base plate 4 and the insulating substrate 2 are stuck to the recess 5b, for example. After step S1, the process proceeds to step S2. In step S2, the terminal portion 6c as the other end portion of the external connection terminal 6 is inserted into the terminal insertion portion 5c of the stuck case 5 so that the connection portion 6b is located on the conductive pattern 1. After step S2, the process proceeds to step S3.

In step S3, the connection portion 6b as the one end portion of the external connection terminal 6 located on the upper surface of the conductive pattern 1 is connected to the conductive pattern 1. The connection portion 6b and the conductive pattern 1 are connected to each other, for example, by placing or applying solder as a bonding material onto the upper surface of the conductive pattern 1, placing the connection portion 6b on the solder, and heating and then cooling the solder.

Ultrasonic bonding may be used in place of connection using the solder. After placing the connection portion 6b on the conductive pattern 1, the connection portion 6b is ultrasonically vibrated from the upper surface of the connection portion 6b using a tool for ultrasonic bonding. Frictional heat generated in the ultrasonic vibration welds the connection portion 6b and the conductive pattern 1 to connect the connection portion 6b and the conductive pattern 1. Ultrasonic bonding eliminates the need for the process of heating and cooling the bonding material such as the solder, leading to reduction in manufacturing time of the semiconductor device 100.

After step S3, the process proceeds to step S4. In step S4, the sealing resin 7, which is the thermosetting resin, is injected into the case 5 to cover the conductive pattern 1 connected to the connection portion 6b, and is heated and then cooled to seal the semiconductor device 100 and fix the external connection terminal 6.

As described above, in the semiconductor device 100 according to Embodiment 1, the one end portion of the external connection terminal 6 is connected to the conductive pattern 1, the case 5 has, in the peripheral wall portion 5a thereof, the terminal insertion portion 5c enabling insertion of the other end portion of the external connection terminal 6, and the portion of the external connection terminal 6 other than the other end portion is sealed by the sealing resin 7 with the other end portion of the external connection terminal 6 being inserted in the terminal insertion portion 5c.

The process of sticking the terminal to the case with an adhesive or the like or the process of fitting a fixing lid for fixing has conventionally been performed to firmly fix the terminal. The semiconductor device 100 eliminates the need for such a process, and can reduce an increase in manufacturing costs of the semiconductor device 100 as the external connection terminal 6 can be fixed to the case 5 only by inserting the other end portion of the external connection terminal 6 into the terminal insertion portion 5c.

The conductive material such as the bonding wire has conventionally been required to be connected between the terminal and the conductive pattern, and the terminal has conventionally been required to be firmly fixed in connecting the conductive material. The semiconductor device 100, however, eliminates the need for the process of connecting the conductive material, and thus the other end portion of the external connection terminal 6 is not required to be firmly fixed.

The process of press fitting the terminal to the case has conventionally been performed to firmly fix the terminal, and there has been a risk of breakage of the terminal or the case in press fitting the terminal to the case formed of a rigid material. The semiconductor device 100, however, eliminates the need for press fitting, and thus a case formed of a rigid material, such as polyphenylene sulfide (PPS), can be used without any risk of breakage.

The one end portion of the external connection terminal 6 is connected to the conductive pattern 1, and the external connection terminal 6 has a larger width than the conductive material such as the bonding wire, so that heat generated in the other end portion of the external connection terminal 6 is easily transferred to the base plate 4. This enables the semiconductor device 100 to include the external connection terminal 6 having favorable heat dissipation.

The other end portion of the external connection terminal 6 is inserted into the terminal insertion portion 5c after sticking the base plate 4 to the case 5, so that various types of pin layout can be selected during manufacture of the semiconductor device 100, allowing for a flexible response to the demand for various types of pin layout.

Bonding of the one end portion of the external connection terminal 6 to the conductive pattern 1 by ultrasonic bonding eliminates the need for the process of heating and cooling the bonding material such as the solder, leading to reduction in manufacturing time of the semiconductor device 100.

In a case where the one end portion of the external connection terminal 6 is bonded to the conductive pattern using the bonding material such as the solder instead of using ultrasonic bonding, an increase in manufacturing costs of the semiconductor device 100 can further be reduced as there is no need to introduce new equipment.

As the base plate, the base plate 4, the insulating substrate 2, and the conductive pattern 1 may integrally be formed. More specifically, the semiconductor device 100 may include a resin insulating base plate including the base plate 4, the insulating substrate 2, and the conductive pattern 1 having integrally been formed. This eliminates the process of connecting the insulating substrate and the base plate, leading to improvement in ease of assembly and further reduction in manufacturing time of the semiconductor device 100.

Embodiment 2

A semiconductor device 100A according to Embodiment 2 will be described next. FIG. 4 is a perspective view illustrating the internal structure of the semiconductor device 100A according to Embodiment 2. In Embodiment 2, the same components as the components described in Embodiment 1 bear the same reference signs, and description thereof is omitted.

As illustrated in FIG. 4, the external connection terminal 6 has a plurality of external connection portions 6d in the other end portion in Embodiment 2. More specifically, two external connection portions 6d are provided to the upper end portion of the terminal portion 6c, for example. The two external connection portions 6d are connected to the same external control board and the like. In this case, the external connection terminal 6 has further improved heat dissipation due to the increase in number of sites of contact to the external control board and the like compared with a case where the number of external connection portions 6d is one. The number of external connection portions 6d is not limited to two, and may be two or more.

Embodiment 3

A semiconductor device 100B according to Embodiment 3 will be described next. FIG. 5 is a perspective view illustrating the internal structure of the semiconductor device 100B according to Embodiment 3. In Embodiment 3, the same components as the components described in Embodiments 1 and 2 bear the same reference signs, and description thereof is omitted.

As illustrated in FIG. 5, the external connection terminal 6 has, in the other end portion, a fixing hole 6e enabling insertion of a shank of a screw in Embodiment 3. More specifically, the terminal portion 6c is U-shaped with its tip portion extending downward, and the fixing hole 6e is provided in the upper end portion of the terminal portion 6c. This enables the external connection portion 6d to be connected to the external control board and the like using the screw, leading to improvement in convenience of the external connection terminal 6.

Embodiment 4

Figure 6:
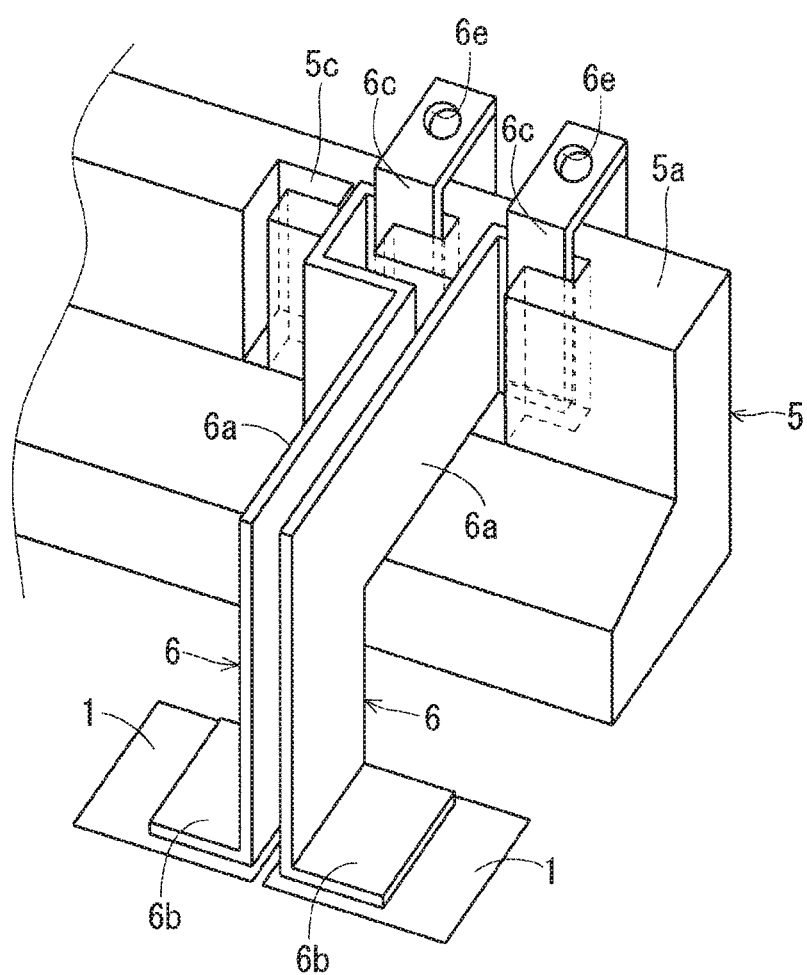
FIG. 6 is a perspective view illustrating the internal structure of a semiconductor device according to Embodiment 4.

A semiconductor device 100C according to Embodiment 4 will be described next. FIG. 6 is a perspective view illustrating the internal structure of the semiconductor device 100C according to Embodiment 4. In Embodiment 4, the same components as the components described in Embodiments 1 to 3 bear the same reference signs, and description thereof is omitted.

As illustrated in FIG. 6, in Embodiment 4, a plurality of external connection terminals 6 are provided, a plurality of terminal insertion portions 5c are provided adjacent to each other, and portions of the plurality of external connection terminals 6 other than the other end portions are sealed by the sealing resin 7 (see FIG. 1) with the other end portions of the plurality of external connection terminals 6 being inserted in the plurality of terminal insertion portions 5c.

Two external connection terminals 6 are arranged adjacent to each other, and thus two body portions 6a are in close proximity to each other. This reduces inductance components of the external connection terminals 6. Although the external connection terminals 6 having the fixing holes 6e are illustrated in FIG. 6, the fixing holes 6e are not essential components, and the external connection terminals 6 may have the external connection portions 6d as illustrated in FIGS. 2 and 4, for example.

Embodiment 5

Figure 7:
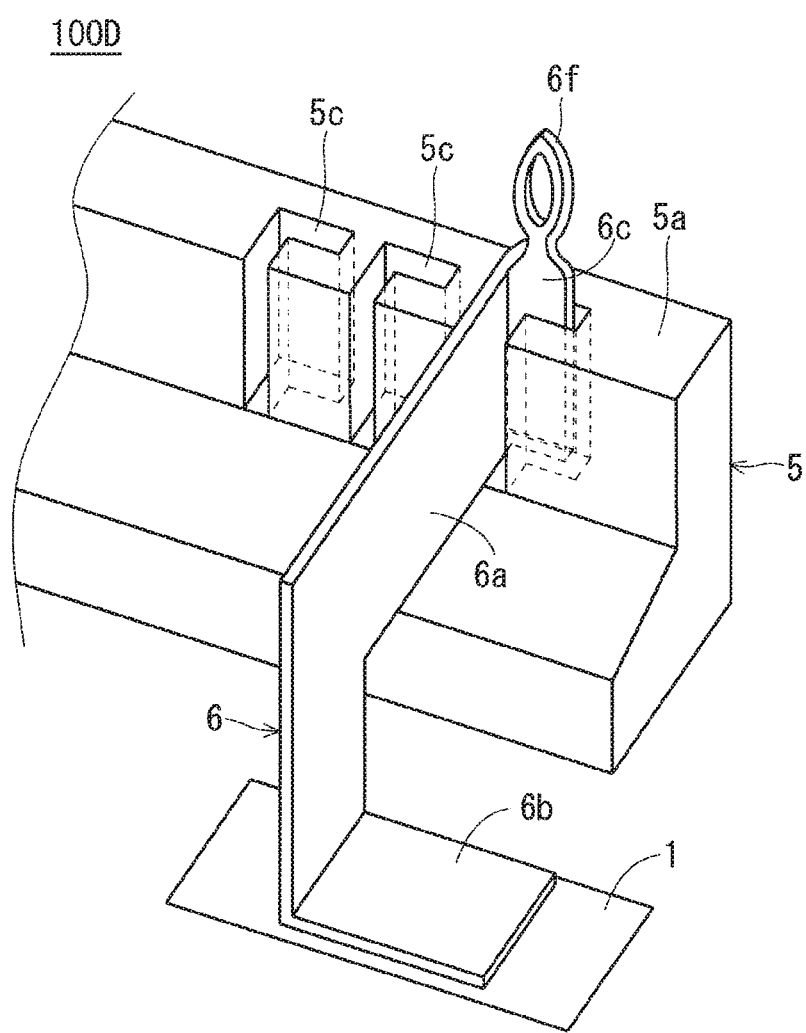
FIG. 7 is a perspective view illustrating the internal structure of a semiconductor device according to Embodiment 5.

A semiconductor device 100D according to Embodiment 5 will be described next. FIG. 7 is a perspective view illustrating the internal structure of the semiconductor device 100D according to Embodiment 5. In Embodiment 5, the same components as the components described in Embodiments 1 to 4 bear the same reference signs, and description thereof is omitted.

As illustrated in FIG. 7, the external connection terminal 6 has a press fit portion 6f in the other end portion in Embodiment 5. The press fit portion 6f is an external connection portion provided to the upper end portion of the terminal portion 6c and having a gap portion. With the press fit portion 6f expanding and contracting about the gap portion, the control board and the like inserted from above can be connected without performing processing such as solder bonding. This improves the convenience of the external connection terminal 6.

Embodiment 6

Figure 8:
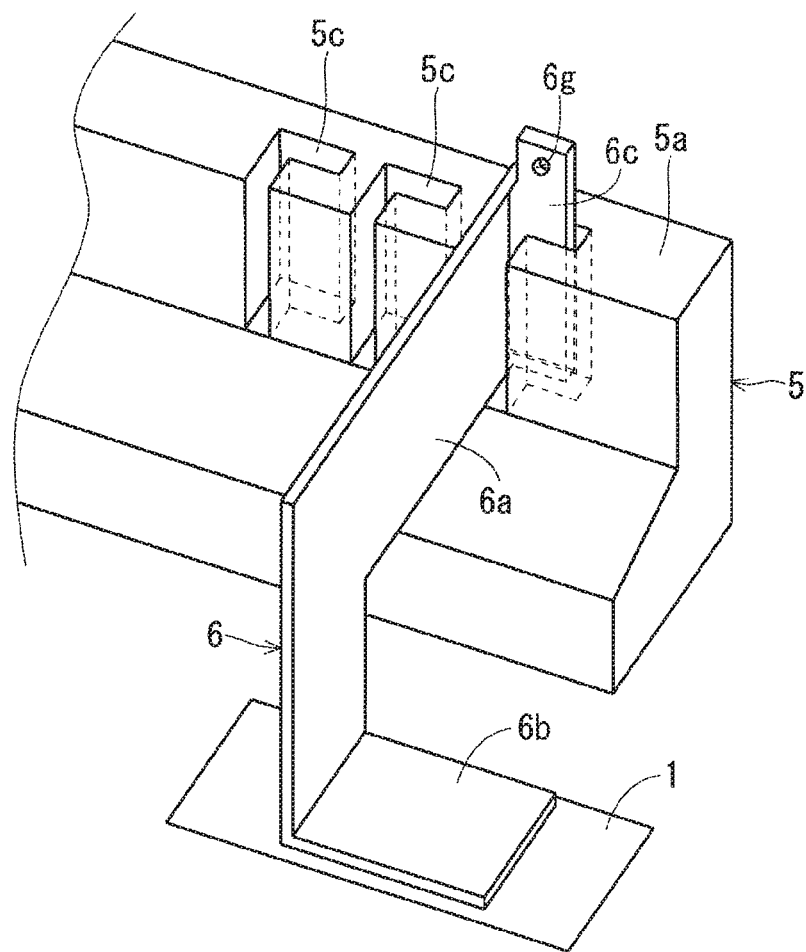
FIG. 8 is a perspective view illustrating the internal structure of a semiconductor device according to Embodiment 6.

A semiconductor device 100E according to Embodiment 6 will be described next. FIG. 8 is a perspective view illustrating the internal structure of the semiconductor device 100E according to Embodiment 6. In Embodiment 6, the same components as the components described in Embodiments 1 to 5 bear the same reference signs, and description thereof is omitted.

As illustrated in FIG. 8, the external connection terminal 6 has a connector portion 6g in the other end portion in Embodiment 6. More specifically, the connector portion 6g is provided in the upper end portion of the terminal portion 6c to enable connector connection. This improves the convenience of the external connection terminal 6.

Embodiments of the present invention can freely be combined with each other, and can be modified or omitted as appropriate within the scope of the invention.

While the invention has been shown and described in detail, the foregoing description is in all aspects illustrative and not restrictive. It is therefore understood that numerous modifications and variations can be devised without departing from the scope of the invention.

What is claimed is:

1. A semiconductor device comprising:
    a base plate;
    an insulating substrate provided on an upper surface of said base plate;
    a conductive pattern provided on an upper surface of said insulating substrate;
    a semiconductor chip mounted on an upper surface of said conductive pattern;
    a case surrounding said base plate, said insulating substrate, said conductive pattern, and said semiconductor chip, said case having a terminal insertion portion, which is L-shaped in a plan view, in a peripheral wall portion thereof;
    a sealing resin sealing an interior of said case; and
    a plate-like external connection terminal provided to said case, including:
        a body portion formed as a plate;
        a connection portion bent in a direction from one end of said body portion and connected to said conductive pattern,
        a terminal portion bent in the direction from the other end of said body, such that the body portion and the terminal portion are L-shaped in plan view; and
        an external connection portion configured to connect to an external control board, wherein
    said terminal insertion portion enables insertion of said terminal portion of said external connection terminal to thereby enable said connection of said external connection terminal to said conductive pattern, and
    with said terminal portion of said external connection terminal being inserted in said terminal insertion portion of said case, a portion of said external connection terminal other than said external connection portion is sealed by said sealing resin.

2. The semiconductor device according to claim 1, wherein
    said base plate, said insulating substrate, and said conductive pattern have integrally been formed.

3. The semiconductor device according to claim 1, wherein said external connection terminal has a plurality of external connection portions.

4. The semiconductor device according to claim 1, wherein said external connection terminal has a fixing hole in said external connection portion, said fixing hole enabling insertion of a shank of a screw.

5. The semiconductor device according to claim 1, wherein
    said external connection terminal comprises a plurality of external connection terminals,
    said terminal insertion portion comprises a plurality of terminal insertion portions provided adjacent to each other, and
    with said terminal portions of said plurality of external connection terminals being inserted in said plurality of terminal insertion portions, portions of said plurality of external connection terminals other than said external connection portions are sealed by said sealing resin.

6. The semiconductor device according to claim 1, wherein said external connection terminal has a press fit portion in said external connection portion.

7. The semiconductor device according to claim 1, wherein said external connection terminal has a connector portion in said external connection portion.

8. A method of manufacturing the semiconductor device according to claim 1, wherein said connection portion of said external connection terminal is bonded to said conductive pattern by ultrasonic bonding.

9. A method of manufacturing the semiconductor device according to claim 1, wherein said connection portion of said external connection terminal is bonded to said conductive pattern using a bonding material.

* * * * *